(12) United States Patent
Chen

(10) Patent No.: US 9,236,517 B2
(45) Date of Patent: Jan. 12, 2016

(54) SOLAR CONCENTRATOR ASSEMBLY HAVING A CONVERGING ELEMENT TO CONVERGE THE MULTIPLE LIGHT BEAMS WITH DIFFERENT WAVELENGTHS FROM A SUNLIGHT SPLITTING ELEMENT

(71) Applicant: HON HAI PRECISION INDUSTRY CO., LTD., New Taipei (TW)

(72) Inventor: Po-Chou Chen, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 64 days.

(21) Appl. No.: 14/252,973

(22) Filed: Apr. 15, 2014

(65) Prior Publication Data

US 2014/0319327 A1    Oct. 30, 2014

(30) Foreign Application Priority Data

Apr. 25, 2013 (TW) .............................. 102114756 A

(51) Int. Cl.
*G01C 21/02* (2006.01)
*H01L 31/054* (2014.01)

(52) U.S. Cl.
CPC ........ *H01L 31/0549* (2014.12); *H01L 31/0543* (2014.12); *Y02E 10/52* (2013.01)

(58) Field of Classification Search
CPC ............ H01L 31/0547; H01L 31/0543; H01L 31/0549; H01L 31/046; H01L 31/02167
USPC .............. 250/203.4, 216, 239, 227.11, 203.6; 356/28, 73; 126/683–685; 136/244–246, 259
See application file for complete search history.

(56) References Cited

U.S. PATENT DOCUMENTS 4,389,085 A * 6/1983 Mori ....................... F21S 11/00
359/591

* cited by examiner

*Primary Examiner* — Que T Le
(74) *Attorney, Agent, or Firm* — Novak Druce Connolly Bove + Quigg LLP

(57) ABSTRACT

A solar concentrator assembly includes a light splitting element, a light converging element, an optical fiber unit and a photoelectric unit. The light converging element is located between the light splitting element and the optical fiber unit. The optical fiber unit is located between the light converging element and the photoelectric unit. The light splitting element splits sunlight into light of different wavelengths. The light converging element converges the split light onto different focal points. The optical fiber unit transmits the converged light to the photoelectric unit. The photoelectric unit converts the light into electrical energy.

15 Claims, 1 Drawing Sheet

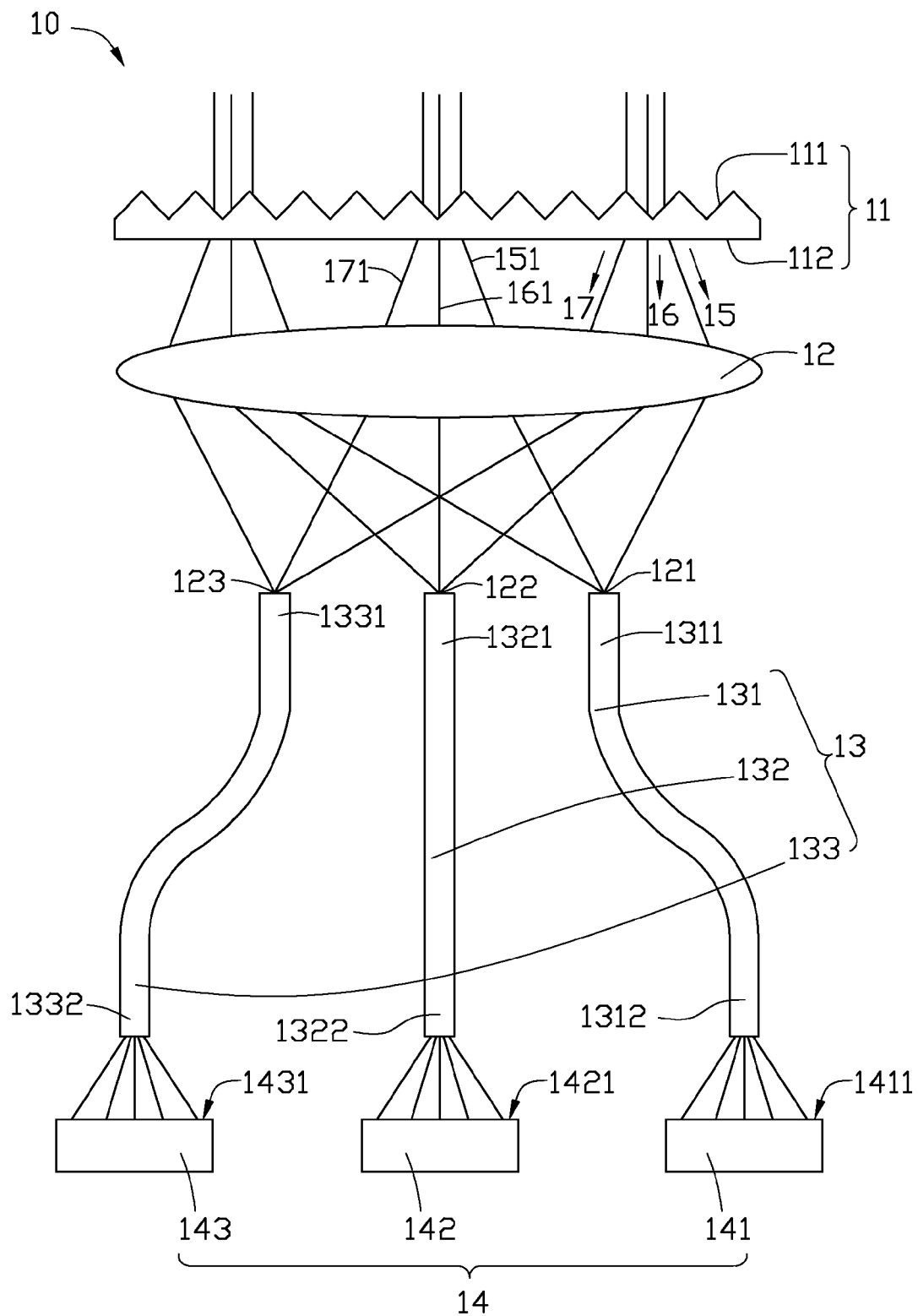

SOLAR CONCENTRATOR ASSEMBLY HAVING A CONVERGING ELEMENT TO CONVERGE THE MULTIPLE LIGHT BEAMS WITH DIFFERENT WAVELENGTHS FROM A SUNLIGHT SPLITTING ELEMENT

FIELD

The present disclosure relates to a concentrator system, and particularly to a solar concentrator assembly with high photoelectric conversion efficiency.

BACKGROUND

Sunlight includes light of different wavelengths. Photoelectric conversion devices made of different materials have different photoelectric conversion efficiencies corresponding to different wavelengths of light. In particular, a photoelectric conversion device used in a solar concentrator assembly only converts light of one wavelength into electrical energy, so the light of other wavelengths is wasted. This causes a low photoelectric conversion efficiency of the solar concentrator assembly.

Therefore, it is desirable to provide a solar concentrator assembly to overcome or at least alleviate the above-mentioned problems.

BRIEF DESCRIPTION OF THE DRAWINGS

The figure is a schematic view of an embodiment of a solar concentrator assembly.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one." The references "a plurality of" and "a number of" mean "at least two."

Embodiments of the disclosure will now be described in detail, with reference to the accompanying drawing.

The figure shows an embodiment of a solar concentrator assembly 10. The solar concentrator assembly 10 includes a light splitting element 11, a light converging element 12, an optical fiber unit 13, and a photoelectric unit 14.

In this embodiment, the light splitting element 11 is a spectral grating. The light splitting element 11 is substantially an elongated strip. The light splitting element 11 has a light incident side 111 and a light output side 112. The light incident side 111 and the light output side 112 are opposite sides of the light splitting element 11.

Light of different wavelengths passing through the light splitting element 11 is refracted at different angles. Thus, sunlight hitting the light incident side 111 substantially perpendicularly, is emitted out of the light output side 112 at different angles. In detail, light emitted out of the light splitting element 11 is split into first light beams 151 travelling along a first direction 15, second light beams 161 travelling along a second direction 16, and third light beams 171 travelling along a third direction 17.

The light converging element 12 is located between the light splitting element 11 and the optical fiber unit 13. The light output side 112 of the light splitting element 11 faces the light converging element 12.

In this embodiment, the light converging element 12 is a converging lens, such as a convex lens, a Fresnel lens, or a set of compound parabolic concentrators (CPC). The first light beams 151 are converged by the light converging element 12 onto a first focal point 121. The second light beams 161 are converged by the light converging element 12 onto a second focal point 122. The third light beams 171 are converged by the light converging element 12 onto a third focal point 123. The first focal point 121, the second focal point 122, and the third focal point 123 are arranged on a focal plane of the light converging element 12.

The optical fiber unit 13 is located between the light converging element 12 and the photoelectric unit 14. The optical fiber unit 13 includes a first optical fiber 131, a second optical fiber 132, and a third optical fiber 133. The first optical fiber 131 has a first light incident end 1311 and a first light emitting end 1312 opposite to the first light incident end 1311. The second optical fiber 132 has a second light incident end 1321 and a second light emitting end 1322 opposite to the second light incident end 1321. The third optical fiber 133 has a third light incident end 1331 and a third light emitting end 1332 opposite to the third light incident end 1331. The first focal point 121 is located on the first light incident end 1311. The second focal point 122 is located on the second light incident end 1321. The third focal point 123 is located on the third light incident end 1331.

The three light emitting ends 1312, 1322, 1332 of the three optical fibers 131, 132, 133 align with the photoelectric unit 14. The photoelectric unit 14 includes a first photoelectric converter 141, a second photoelectric converter 142, and a third photoelectric converter 143. In one embodiment, the first photoelectric converter 141 is made of germanium, which has a low energy gap of about 0.6 electron volts (eV). The first photoelectric converter 141 converts the first light beams 151 into electrical energy. In one embodiment, the second photoelectric converter 142 is made of indium gallium arsenide, which has a middle energy gap of about 1.3 eV. The second photoelectric converter 142 converts the second light beams 152 into electrical energy. In one embodiment, the third photoelectric converter 143 is made of gallium indium phosphide, which has a high energy gap of about 1.9 eV. The third photoelectric converter 143 converts the third light beams 153 into electrical energy. The first photoelectric converter 141 has a first receiving surface 1411 aligned with the first light emitting end 1312 of the first optical fiber 131. The second photoelectric converter 142 has a second receiving surface 1421 aligned with the second light emitting end 1322 of the second optical fiber 132. The third photoelectric converter 143 has a third receiving surface 1431 aligned with the third light emitting end 1332 of the third optical fiber 133. Each of the three photoelectric converters 141, 142, and 143 can be a solar cell, a photodiode, or other suitable device for converting light into electrical energy. In this embodiment, the three photoelectric converters 141, 142, and 143 are solar cells.

In use, the first light beams 151, the second light beams 161, and the third light beams 171 are converted into electrical energy by the first photoelectric converter 141, the second photoelectric converter 142, and the third photoelectric converter 143, respectively. The first photoelectric converter 141, the second photoelectric converter 142, and the third photoelectric converter 143 can optimally convert light of different wavelengths into electrical energy.

Even though numerous characteristics and advantages of the present embodiments have been set forth in the foregoing description, together with details of the structures and functions of the embodiments, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A solar concentrator assembly comprising:
a light splitting element configured to split sunlight into first light beams travelling along a first direction, second light beams travelling along a second direction, and third light beams travelling along a third direction, the first, second, and third light beams being of different wavelengths;
a light converging element located between the light splitting element and an optical fiber unit configured to converge the first, second and third light beams respectively;
the optical fiber unit located between the light converging element and a photoelectric unit comprising a first optical fiber, a second optical fiber, and a third optical fiber, the first, second and third optical fibers respectively receiving and transmitting the first, second, and third light beams converged by the light converging element; and
the photoelectric unit comprising a first photoelectric converter, a second photoelectric converter, and a third photoelectric converter, the first, second, and third photoelectric converters respectively converting the first, second and third light beams into electrical energy.

2. The solar concentrator assembly of claim 1, wherein the light splitting element comprises a light incident side and a light output side.

3. The solar concentrator assembly of claim 2, wherein the light output side of the light splitting element faces the light converging element.

4. The solar concentrator assembly of claim 1, wherein the first optical fiber has a first light incident end and a first light emitting end opposite to the first light incident, the second optical fiber has a second light incident end and a second light emitting end opposite to the second light incident end, and the third optical fiber has a third light incident end and a third light emitting end opposite to the third light incident end.

5. The solar concentrator assembly of claim 4, wherein the light converging element converges the first, second and third light beams respectively onto a first focal point, a second focal point, and a third focal point, and the first, second, and third focal points are respectively located on the first, second, and third light incident ends.

6. The solar concentrator assembly of claim 4, wherein the first, second, and third light emitting ends respectively align with the first, second, and third photoelectric converters.

7. The solar concentrator assembly of claim 1, wherein the first photoelectric converter is made of germanium having a low energy gap, the second photoelectric converter is made of indium gallium arsenide having a middle energy gap, and the third photoelectric converter is made of gallium indium phosphide having a high energy gap.

8. The solar concentrator assembly of claim 1, wherein the light splitting element is a spectral grating.

9. The solar concentrator assembly of claim 1, wherein the light converging element is a condenser lens.

10. The solar concentrator assembly of claim 9, wherein the light converging element is a convex lens.

11. The solar concentrator assembly of claim 9, wherein the light converging element is a Fresnel lens.

12. The solar concentrator assembly of claim 9, wherein the light converging element includes compound parabolic concentrators (CPC).

13. The solar concentrator assembly of claim 1, wherein the three photoelectric converters are solar cells.

14. The solar concentrator assembly of claim 1, wherein the three photoelectric converters are photodiodes.

15. A solar concentrator assembly comprising:
a light splitting element configured to split sunlight into multiple light beams travelling along different directions, each of the light beams being of different wavelengths;
a light converging element configured to converge the multiple light beams respectively;
an optical fiber unit comprising multiple optical fibers, each optical fiber respectively receiving and transmitting one of the light beams converged by the light converging element; and
a photoelectric unit comprising multiple photoelectric converters, each photoelectric converter respectively converting one of the light beams into electrical energy.

* * * * *